United States Patent [19]
Stubbs

[11] Patent Number: 5,309,352
[45] Date of Patent: May 3, 1994

[54] METHOD AND SYSTEM FOR OPTIMIZING TERMINATION IN SYSTEMS OF PROGRAMMABLE DEVICES

[75] Inventor: David D. Stubbs, Portland, Oreg.

[73] Assignee: Tektronix, Inc., Wilsonville, Oreg.

[21] Appl. No.: 525,814

[22] Filed: May 18, 1990

[51] Int. Cl.$^5$ .................... G05B 11/01; G05B 9/02; G01R 15/12
[52] U.S. Cl. .................... 364/140; 364/141; 364/492; 324/73.1
[58] Field of Search ........... 364/140, 141, 138, 146, 364/147, 192, 474.11, 200, 900, 492, 184, 187, 493; 371/16.1; 324/73.1; 328/75

[56] References Cited

U.S. PATENT DOCUMENTS

| | | | |
|---|---|---|---|
| 3,764,995 | 10/1973 | Helf, Jr. et al | 371/16.1 |
| 4,029,950 | 6/1977 | Haga | 364/474.11 |
| 4,069,488 | 1/1978 | Fiorenza et al. | 364/474.11 |
| 4,293,915 | 10/1981 | Carpenter et al. | 364/146 |
| 4,425,630 | 1/1984 | Yomogida et al. | 364/141 |
| 4,486,830 | 12/1984 | Taylor, Jr. et al. | 364/146 |
| 4,606,001 | 8/1986 | Rieben et al. | 364/192 |
| 4,661,912 | 4/1987 | Imanishi | 364/468 |
| 4,674,031 | 6/1987 | Siska, Jr. | 364/184 |
| 4,747,041 | 5/1988 | Engel et al. | 364/492 |
| 4,802,164 | 1/1989 | Fukuoka et al. | 371/16 |
| 4,868,785 | 9/1989 | Jordan et al. | 364/900 |
| 4,894,829 | 1/1990 | Monie et al. | 371/20.1 |
| 4,916,642 | 4/1990 | Kaiser et al. | 364/550 |
| 4,964,058 | 10/1990 | Brown, Jr. | 364/492 |
| 5,058,028 | 10/1991 | Meyerle | 364/474.11 |

OTHER PUBLICATIONS

Per Brinch Hansen, *Operating System Principles*, Prentice Hall Series in Automatic Computation, Prentice-Hall, Inc., 1973, pp. 77-81.

*Primary Examiner*—Jerry Smith
*Assistant Examiner*—Paul Gordon
*Attorney, Agent, or Firm*—Edward B. Anderson; Francis I. Gray

[57] ABSTRACT

An equipment test program, stored and processed in a computer system, defines device termination procedures used for terminating devices used in a plurality of sets for performing a plurality of tests. The termination procedure for each device is associated with an ensemble, or group data structure. Each ensemble contains a set of termination task data structures for implementing the device terminations. Each task represents a device that operates with other devices in a test program module. Each task is linked to zero or more predecessor tasks in the ensemble. This linking represents the need to turn off the predecessor tasks' devices first before turning off any task's device. Within each test module, and before any device in the group is instructed to operate, the ensemble optimization procedure is invoked to pass a pointer to the module's ensemble data structure. The ensemble optimization procedure is used to optimally decide which device termination procedures should be invoked. Specifically, the ensemble procedure is used to determine which devices in the current ensemble must be turned off because they are not in the new ensemble. Those devices are turned off by recursively turning off their predecessor devices, then turning off those devices. Next, the procedure is used to determine which devices in the current ensemble must be turned off to allow installation of devices in the new ensemble. Again, those devices are turned off by recursively turning off their predecessor devices, then turning off those devices.

22 Claims, 4 Drawing Sheets

METHOD AND SYSTEM FOR OPTIMIZING TERMINATION IN SYSTEMS OF PROGRAMMABLE DEVICES

FIELD OF THE INVENTION

This invention relates to controlling computer-controlled devices, and particularly, to controlling a plurality of such devices that are used for performing an operation.

BACKGROUND OF THE INVENTION

The preferred embodiment of the present invention is particularly directed to a method and system for optimizing the termination of programmable or directly or indirectly computer-controlled test equipment, for performing a variety of tests on a device under test. Equipment may be controlled indirectly by screen or other prompts to a human operator to change equipment states. In such systems, a piece of equipment, such as a power supply, as well as the linkage between the equipment and the device under test, are referred to as "devices" as contemplated herein. Depending upon the tests to be performed, various sets of devices are coupled to each other and the device under test in order to perform various tests on it.

The present invention, however, may be practiced in any general system that uses a plurality of devices in a combination or set to perform a test or operation. Thus, the concept may be used to control fluid flow systems where different combinations of fluid paths exist or other such system control applications.

Systems of programmable devices, such as test instruments, signal routing devices, and devices-under-test, including devices controlled directly by signals from a computer or by human operators according to directions displayed or otherwise presented by a computer according to a software program (test program) running on a computer, are often written as a compromised attempt to address several issues: total test time, test system wear, test module positional flexibility within a test program and portability among test programs and test systems, and operator, test system, and device-under-test safety.

In most test situations, total test time is to be minimized: the shorter the time required to examine a device-under-test, the more devices that can be tested. At the same time, it is desirable that an activity that tends to wear out mechanical parts of the test system be eliminated. The phenomenon known as cycling is typically the major cause of longer test times and mechanical wear.

Test instruments and signal paths experience cycling as different groups of these devices are called into or released from use. Cycling is the repeated turning on and turning off of a signal source or destination device, or the making and breaking of a signal path between two devices, for example, through a switch matrix. Cycling is the major cause of wear and failure when devices implement their on/off control with mechanical parts. Cycling also takes time to initiate and complete and thus reduces the rate at which measurements can be made and devices-under-test can be tested.

Test programs are often written to consist of modular test or measurement procedures (test modules). Modular, here, means independence from both a test program's history and its future. That is, a test module is written in such a way that it does not depend on the execution of a previous or a next test module.

Modularity confers several benefits. When truly modular, the sequence in which test modules are executed in a test program can be altered without changing the internal structure of any module. This positional modularity allows test modules to be re-ordered, for example, to run tests that detect frequent device-under-test failures early and thus reduce total test time. Modularity can also permit test modules to be used not only in different test programs written in a compatible style but also in test programs run on different but compatible test systems. This portable modularity allows tests to be run in isolation, for example, to analyze the behavior of a device-under-test in the specific circumstance created by the test module. Portable modularity can also reduce test programming costs by eliminating the need to re-create existing test modules when new test programs must be written.

Test programmers must address problems of safety. To address ordering safety, they must arrange for their test modules to turn devices on and off in sequences that will avoid damage to other devices. For example, a signal path should be broken after a source device turns off to prevent the signal path switches from arcing. Power to the SHUNT winding of an electric motor should be turned off before power to the ARMATURE winding to prevent the motor from turning faster than its design limits. To address hazard safety, programmers must provide ways to protect system devices, devices under test, and test system operators from suddenly occurring hazardous conditions by quickly shutting down all instruments that are on. "Shutting down" is equivalent to returning to what may be considered a safe, benign or quiescent state.

Test programmers can use various techniques to address these issues, but the common approaches compromise in one or more areas to achieve gains in another.

In the simplest solution, test modules are written to achieve perfect positional and portable modularity and order safety by sacrificing test time and equipment wear to cycling and ignoring hazard safety. Here, each test module is written to turn on the devices it requires in a safe order (order safety), perform the test, and turn off the devices in a safe order. A problem—in this case hazard safety—is said to be ignored by a technique when the technique plays no role in its solution, even though it may be addressed by other means.

Two solutions allow test programmers to optimize their programs with respect to cycling by sacrificing modularity and ignoring hazard safety.

Using command-pair removal, a programmer can selectively remove pairs of off and on commands that control a device from the interiors of a fixed sequence of test modules leaving a minimal number of safely ordered on and off commands. The remaining code thus reflects the assumption that once the device has been turned on it will stay on. This approach severely restricts a test module's positional modularity and destroys its portable modularity. For example, if a first test module is moved to run after a second test module, and the test modules have been modified to reduce the amount of cycling, the program would not work properly unless deleted code was reinstated to both modules. The test modules, thus, depend on a specific execution history and anticipate a specific execution future.

Using special-case checking, test modules can reduce cycling to a minimum, provide limited positional modularity, and insure order safety. Special-case checking destroys portable modularity and ignores hazard safety. When a test module can be executed with a plurality of possible execution histories - different sets of devices left on - special-case checks can determine which test module was executed previously and control devices accordingly. These checks allow a limited number of specific execution histories and, thus, make a module insensitive to small positional changes of its predecessors. Conversely, it allows predecessor modules to change their position as long as the move has no effect on the future module. Most changes in modular order or addition or removal of modules force at least re-analysis of each special-case check. Test modules with special case checks depend on a specific set of execution histories and typically anticipate a specific execution future.

Two techniques are available that require no specific execution history but rather deal with all possible execution histories. In the off-list technique, cycling is reduced to minimum and positional modularity is achieved. Portable modularity and order safety are compromised, and hazard safety is ignored. Each test module provides a list of all test system devices that must be off before the module can begin its work - the off-list. The test module itself or a test system utility procedure tells each device represented in the list to turn off. By leaving selected devices out of the list, those devices can be left on if they were already on. The test module then proceeds to turn on the devices it needs, redundantly turning on those that were left on, and performs the test. If the off-list is structured to safely turn off devices based on a specific history, the module loses its positional modularity. If the list is not ordered for a specific history, it cannot guarantee that devices left on by a previous module will be turned off in a safe order. Test modules with off-lists are not directly portable to test systems that include different devices since those devices are not represented in the module's off-list but may have been left on by a previous test module. The off-list technique allows test modules to deal with all possible execution histories, ignore impact on the execution of future modules, and requires that they know all devices in the test system on which they execute.

In the on-list technique, cycling is reduced to a minimum, positional and portable modularity and hazard safety are achieved, but complete order safety is not possible. Each test module provides a list of all test system devices it will turn on and leave on. Then, a test system utility procedure can turn off every device known to the test system that is not in the on-list. By placing the responsibility of knowing all devices in the test system on the test system utility, the test module becomes portable. By providing a list of devices that are on or will be turned on, a hazard safety procedure can quickly turn off these devices if the need arises. This list can be safely ordered to turn off devices in a correct order even in a hazardous situation. The technique does not completely address order safety, however. When the test system utility compares its list of devices with those in a module's on-list, it has no way of knowing the order in which it should turn off devices that are not in the test module's on-list. The on-list technique allows test modules to deal with all possible execution histories, ignore impact on the execution of future modules, and ignore the presence of test system devices they do not use.

There remains, therefore, a need for a method and system that will allow test modules to be written in a way that reduces test execution time and test system wear by reducing cycling, is modular with respect to position in a test program and portable to other compatibly written test programs and test systems, that provides order safety with respect to other devices in the test system, and that assists a hazard safety test program subsystem by providing a safely ordered list of devices in a test system that are currently turned on.

SUMMARY OF THE INVENTION

The present invention overcomes the limitations of the conventional ways of preparing test programs by providing an optimization routine that automatically does the analysis and device controlling for interfacing between two consecutive test modules or operations.

More particularly, the present invention provides a method and system for controlling the deactivating of computer-controlled devices. Included in the method are the steps of inputting into a computer system data describing and for operating a plurality of computer-controlled devices, and inputting data defining a first operation using a first set of the plurality of devices. Data is input into the system for initiating the performance of the first operation using the first set of devices. Prior to performing the first operation using the first set of devices, devices that are active that are not in the first set are deactivated. Devices in the first set that are inactive are activated. Thus, any devices that were in an active state prior to initiation of the first operation and which are part of the first set, remain active and are not cycled.

In the preferred embodiment for practicing the present invention, a system is provided for controlling the turning off of computer-controlled test equipment during a plurality of tests, with each test using one of a plurality of sets of test devices. Data is input into a test-equipment-controlling computer system for defining tests that are to be performed and defining the set of test devices required for each test module. Instructions are input into the system appropriate for determining which devices are presently on that are to be turned off for the current test, and turning them off.

Preferably, additional information is input into the system for each device. This information includes a system-wide device termination procedure for turning off the device. Further, for each use of a device in a module, a device status indicator to indicate whether the device is off or on, and a list of other devices used in that module that must be turned off before this device can be turned off are provided. The step of turning off a device thus includes turning off all devices in the list of other devices prior to turning off the device, turning off the device using the associated device termination procedure, and setting the status indicator to indicate that, for this use, the device is off. As a result, devices that do not need to be turned off are not turned off.

It can be seen that by invoking this procedure prior to performing each test module, the cycling of devices will be minimized and the devices will be properly deactivated or left active as required in order to perform the various operations or tests.

These and other features and advantages of the present invention will become apparent from a reading of the following detailed description of the preferred embodiment with reference to the associated drawings.

BRIEF DESCRIPTION OF THE DRAWINGS AND APPENDIX

DETAILED DESCRIPTION OF THE PREFERRED METHOD AND EMBODIMENT

Figure 1:
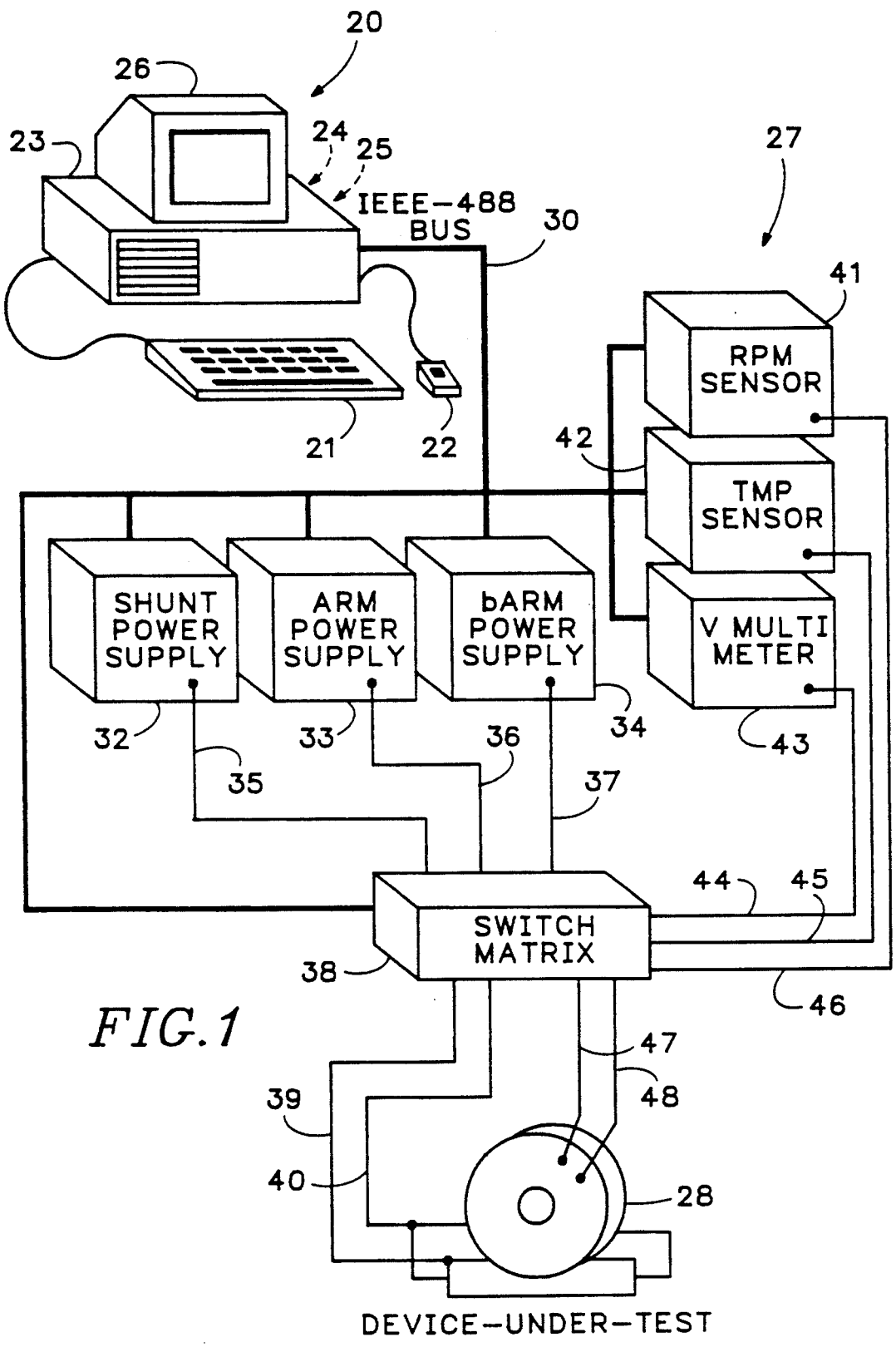
FIG. 1 is an illustration showing a plurality of computer-controlled test equipment devices that are coupled together for testing a device under test and coupled to a computer system made according to the present invention.

Referring initially to FIG. 1, a system 20 for practicing the method of the present invention is shown. System 20 includes a keyboard 21 and a mouse 22 as input devices to a computer 23 having memory 24 (not shown), processor 25 (not shown), and display 26 as its visual output device, all for controlling a programmable test instrumentation system, generally shown as 27, for stimulating a device-under-test (DUT) 28, such as an electric motor, and detecting and analyzing its response.

Instrumentation system 27 includes an interface bus (IEEE-488) 30, three signal-generating instruments 32, 33, 34, three signal-sensing instruments 41, 42, 43, and switch matrix 38, all connected to bus 30 for receiving control signals from system 20. Instruments 32, 33, and 34 are power supplies, identified as SHUNT, ARM (armature) and bARM, respectively, connected by connections 35, 36, and 37, respectively, to switch matrix 38 for distribution via connections 39 and 40 to DUT 28. Instruments 41, 42, 43, are sensors for rotation speed (RPM), temperature (TMP), and voltage (V), respectively, connected via connections 44, 45, and 46, respectively, to switch matrix 38 for sensing signals conducted to and distributed by switch matrix 38 from DUT 28 via connections 47 and 48. Each of the instruments, 32, 33, 34, 41, 42, 43, and switch matrix 38 may be controlled by computer system 20. Computer system 20 preferably includes block diagram editor software for creating and editing block diagrams representing data flow, as disclosed in U. S. Pat. No. 4,868,785 issued to Jordan et al. on Sep. 19, 1989 for a "Block Diagram Editor and Method for Controlling Electronic Instruments", assigned to the assignee of the present invention.

Figure 2:
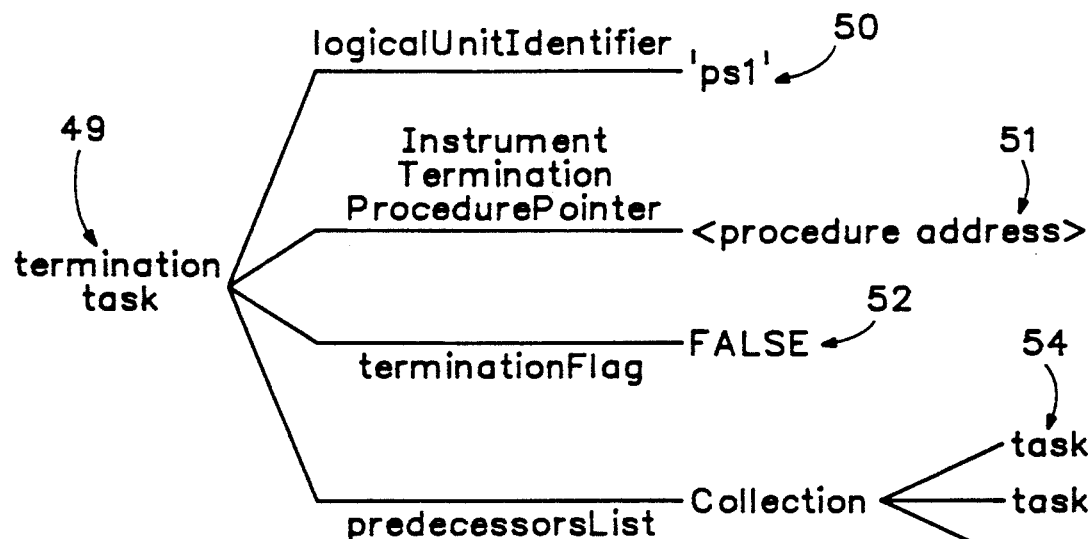
FIG. 2 shows the data structure representing a termination task associated with the use of a device in a test module.

During creation of a test program, according to the present invention, a programmer defines device termination procedures for each device in the system as well as ensemble data structures. Each ensemble represents a group or set of devices, such as the instruments and connections shown in FIG. 1. Each ensemble contains a set of termination task data structures, as shown in FIG. 2. Each task represents use of a device, such as an instrument or connection between instruments, available to operate with other devices in a test program module, for example, a measurement or test procedure. Further, each task is linked to zero or more predecessor tasks in the ensemble. This linking represents the need to turn off a predecessor task's device before turning off a specific task's device. Within the module, and before any device in the group is instructed to change its settings, turn on, make a measurement, or otherwise operate, a programmer inserts a program line to invoke the ensemble optimization procedure of the present invention, passing a pointer to the module's ensemble data structure. The ensemble optimization procedure determines which device termination procedures should be invoked, and invokes them.

If the ensemble pointer points to an ensemble other than the one the system holds as representing the currently active ensemble, the current ensemble pointer, the two optimization procedures are called to selectively and in proper order turn off devices represented by termination tasks in the current ensemble. The termination flags of each termination task associated with this ensemble are set to show the termination procedure has not been run for this encounter with the group of devices. A pointer to this ensemble is installed as the current ensemble pointer are installed and control returns to the test program module.

There are two optimization procedures associated with an ensemble that are used to determine which termination tasks of the current ensemble must run their recursive termination procedure to turn off devices. In a terminate-to-remove-old-devices procedure, devices used in the "current" ensemble but not in a new ensemble are turned off.

In a terminate-to-install-new-devices procedure, devices used in both the current and the new ensembles which must be turned off to allow set up of new devices in the new ensemble, are turned off. This optimization technique is based on the assumption that if a termination task in the new ensemble will require a predecessor task to terminate before it terminates, and the predecessor has a counterpart (same logical unit identifier, or device) in the current ensemble, that counterpart must run its recursive termination procedure to allow setup of the new device.

A current ensemble termination procedure, run at the end of the test program, is used to turn off in proper order the devices currently assumed to be on. Similarly, the current ensemble termination procedure may be called from anywhere within a test program to force all devices to turn off. The recursive termination procedure is run for each termination task of the ensemble pointed to by the current ensemble pointer.

Specifically, the ensemble procedure is used to determine which devices in a current ensemble must be turned off because they are not in the new ensemble. Those devices are turned off by recursively turning off their predecessor devices, if any, then turning off those devices. Next the devices in the current ensemble that must be turned off to allow installation of devices in the new ensemble are determined. Again those devices are turned off by recursively turning off their predecessor devices, if any, then turning off those devices. At the end of the test program, the programmer inserts a line to call a current ensemble termination procedure to turn off the last group of devices in the proper order.

The ensemble optimization procedure, as the preferred method of practicing the invention, includes a device termination procedure. This procedure is used to turn off a device in the system by sending commands through communication paths, such as through interface bus 30. The procedure also includes a plurality of ensembles that are collections of termination tasks for a group of devices to be physically connected and used together to carry out a measurement activity of a test module. A current ensemble pointer provides a program memory location available to the ensemble optimization procedure that initially holds a nil value. When an optimization procedure runs, this pointer is updated with a pointer to the ensemble representing the currently active group of devices, the current ensemble.

A data structure 49, referred to as a termination task, is representative of the need to turn off one device in an ensemble. The termination task includes a logical unit identifier that designates which device in the system this termination task addresses. The use of a logical unit identifier 50 effectively decouples particular physical devices from the device termination procedures capable of turning them off. This allows a device termination procedure to be used to turn off any device of a type, such as power supplies or function generators. The logical unit identifier specifies which particular device, such as instrument 32, 33 or 34. FIG. 2 illustrates this element of the termination task with the example for the logical unit identifier shown as 'psl'.

The termination task also includes a device or instrument termination procedure pointer 51, shown as <procedure address> in FIG. 2. This pointer can be resolved to a device termination procedure for turning off that type of device. The device termination procedures can be the same for a plurality of different instruments of the same type as mentioned previously. These procedures are conventionally known and are as illustrated in U. S. Pat. No. 4,868,785. A termination flag or indicator shown generally at 52 shows whether the associated device termination procedure has been run. That is, it shows whether the device is in an active or inactive state. If the termination procedure has been run, it has been terminated or deactivated. At the beginning of a test module, the flag is initially defined to show the procedure has not been run.

The termination task may alternately contain no termination flag. Instead, a memory location established and maintained by the test program reflects the status of each device and provides this information to parts of the system that need it. Each memory location represents the on/off state of one device. By convention, and possibly using utility procedures provided by the test program, a status flag is updated to reflect the state of its associated device when that state is changed. That is, when the device is turned on or off, the status flag for that device is updated to reflect the new device state. Techniques of providing secure access when setting and testing these flags are well-known as the subject of "mutual exclusion" and are discussed in most computer science operating system texts ("Operating System Principles", Per Brinch Hansen, Prentice Hall Series in Automatic Computation, Prentice-Hall, Inc., 1973, page 77).

With respect to the present invention, the recursive termination procedure can test the system-provided status flag to determine whether the device termination procedure should be run. The device termination procedure, when invoked, would typically assume the task of modifying the status flag to show the device had been turned off. The system-provided status flag is additionally useful when deciding whether to send commands to turn a device on. Frequently, if a device has been left on by a previous test module, nothing further need be done to keep it in that useful state. By testing a device's status flag, a test module can decide whether the turn on commands actually need to be issued.

Finally, the termination task includes a list 54 of pointers to predecessor termination tasks associated with other devices in the same ensemble that must be turned off before this device can be turned off. The predecessor list 54, as represented by the collection of tasks shown generally in FIG. 2, must be constructed so that no task is one of its own predecessors. That is, the graph of tasks must be acyclic.

A recursive termination procedure is associated with a termination task to assure device termination procedures are run in the proper order by the following method. According to the recursive termination procedure, a determination is made as to whether the associated task has already run its associated device termination procedure by checking the task's termination flag. If the flag shows the termination has run (e.g., contains value TRUE), control returns to the ensemble procedure. If the flag shows the termination has not run (e.g., contains value FALSE), the recursive termination procedure calls itself (recurses) for each of this task's predecessor tasks. This task's termination procedure pointer is then resolved and the associated device termination procedure is run. After the termination procedure has run, this task's termination flag is set to TRUE.

An alternative recursive termination procedure would dispense with the termination flag. Instead, a list of terminated tasks, initially empty, is created. This list is passed to the recursive termination procedure as it is run for each task whose device needs to be turned off. A task's presence in the list shows its associated instrument has been turned off and no further action is needed. If the task is not in the list, the procedure is as described with the previous procedure in running the device's termination procedure. The task is then added to the termination list and control is returned to the ensemble optimization procedure.

The ensemble optimization procedure is used to determine whether optimization methods must be run, by the following steps. If the current ensemble pointer is nil, as it is at the beginning of a test program, then this is the first group of devices to be used by the test program. No optimization is needed. A pointer to this ensemble is installed as the current ensemble pointer, and control returns to the test program module.

If the current ensemble pointer points to this ensemble, the devices are being used together another time, as in a loop. No optimization is needed, so control returns to the test program module.

Figure 3:
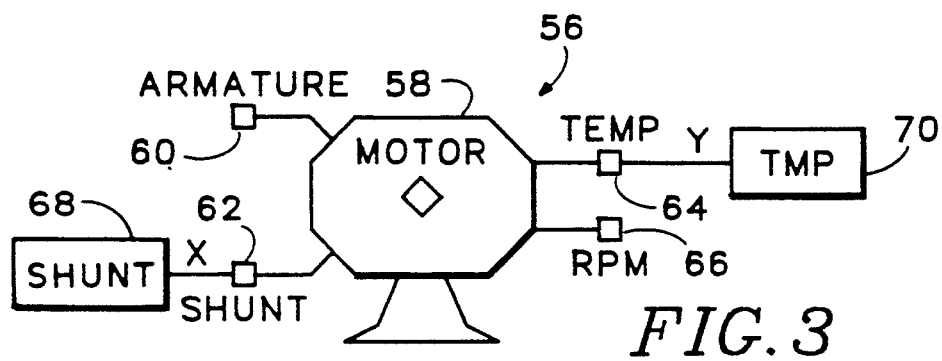
FIG. 3 shows a representative block diagram of a configuration of test devices.
Figure 5:
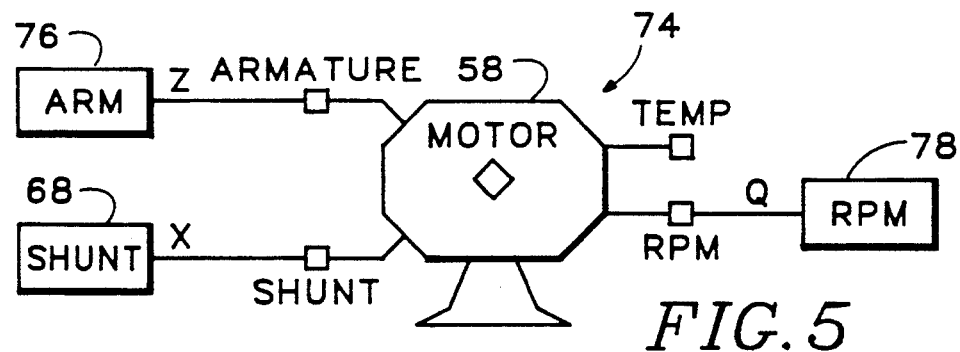
FIG. 5 is similar to FIG. 3 showing a second test configuration.
Figure 7:
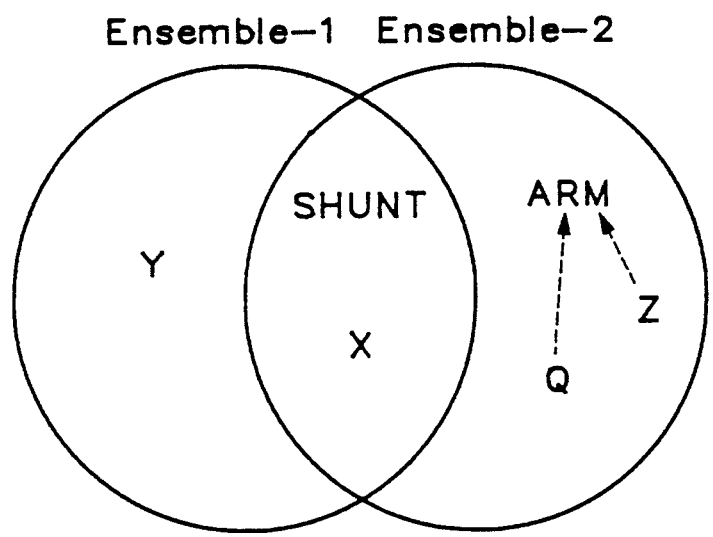
FIG. 7 is a Venn diagram showing the relationship of the sets of devices for ensembles 1 and 2.
Figure 8:
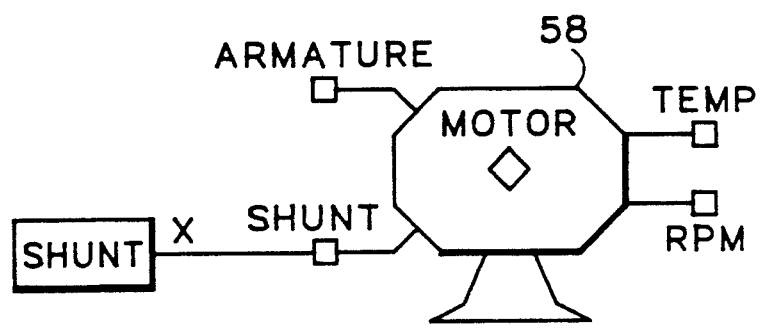
FIG. 8 shows an equipment configuration existing during the transition from the configuration of FIG. 3 to that of FIG. 5.
Figure 9:
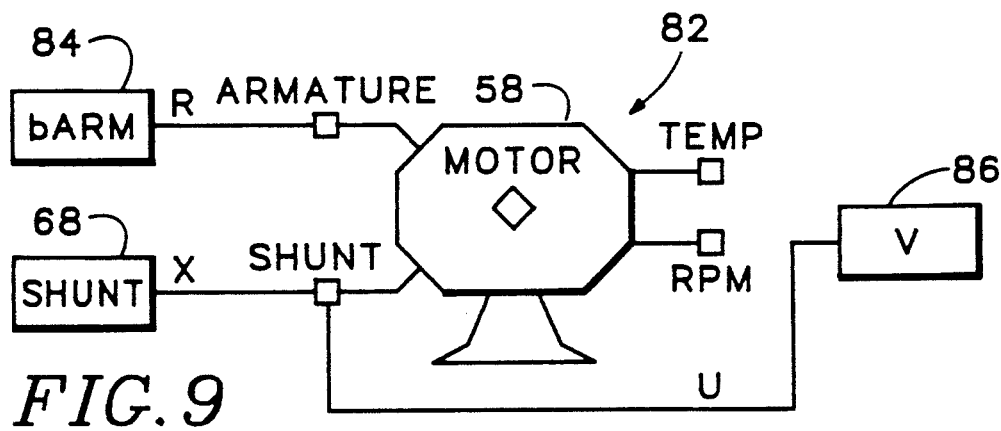
FIG. 9 is a third configuration similar to FIGS. 3 and 5.

FIGS. 3–11 provide an example of cycling through three equipment tests using three different device configurations, as particularly illustrated in FIGS. 3, 5 and 9, according to the preferred embodiment for practicing the present invention. FIG. 3 shows a group or set of devices 56 connected together to perform a temperature measurement. An electric motor 58 has two power terminals 60 and 62. Terminal 60 is for the armature (ARM) winding and terminal 62 is for the SHUNT winding. Motor 58 also has a terminal 64 for making a temperature measurement and a terminal 66 for making an RPM measurement.

FIG. 3 also shows a SHUNT power supply 68 that, when on, supplies power to the SHUNT power terminal through connection X. A temperature measurement device (TMP) 70 is connected to temperature connector 64 by connection Y. Connections X and Y are implemented by a programmable signal routing device of conventional form. The labels correspond to the logical unit identifiers used in the test program. They indicate which particular instruments are used in this configuration or set.

Figure 4:
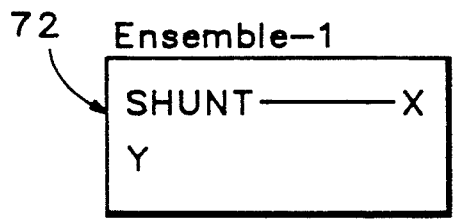
FIG. 4 illustrates an ensemble identifying the devices used in the test of FIG. 3 and any termination ordering requirements.

FIG. 4 shows a first ensemble, Ensemble-1, in a box 72, associated with the configuration of FIG. 3. Here, the labels refer to the termination tasks (SHUNT, X, Y), associated with programmable devices in FIG. 3. TMP 70 is a member of a class of devices commonly found in test systems for which termination is not necessary. These labels also correspond to the logical unit identifiers discussed previously. The line between SHUNT and X indicates termination order: SHUNT must be turned off before switch contacts or other mechanisms of physical connection open to break connection X. The order can also be viewed as expressing the forbidden state where X is turned off while SHUNT is still on.

Before the devices of FIG. 3 are turned on, the ensemble optimization procedure is run for Ensemble-1. Since no ensemble precedes it, the current ensemble pointer initially is nil. So, a pointer to Ensemble-1 is installed in the current ensemble pointer at the time the optimization procedure is run. The rest of the test module is executed for setting up the connections, turning on the power supply, and running the rest of the temperature test.

Figure 6:
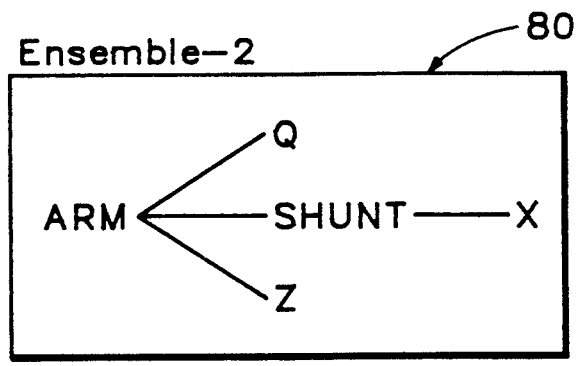
FIG. 6 is an ensemble for the configuration of FIG. 5.

FIG. 5 shows the next configuration 74 used in the test program. Here, a second power supply (ARM) 76 will be connected to the motor's armature terminal 60 by connection Z, and an RPM measurement device 78 will be connected to the RPM terminal 66 by connection Q. Connection Y and the TMP device 70 will not be used. FIG. 6 shows the ensemble, Ensemble-2 and its tasks associated with FIG. 5.

At the beginning of the RPM test of FIG. 5, the ensemble optimization procedure is run for Ensemble-2. Because the current ensemble pointer does not point to Ensemble-2, the procedure determines that two optimization procedures will be run.

The terminate-to-remove-old-devices procedure performs a mathematical set subtraction operation, CurrentEnsemble−Ensemble-2, to find tasks in the current ensemble with no counterparts in the new ensemble. The recursive termination procedure is run for those tasks. A task's counterpart is a task associated with the same device through a common logical unit identifier.

FIG. 7 shows a Venn diagram of the two sets of tasks. The left-most portion contains the result of the subtraction: Task Y is the only task in the current ensemble with no counterpart in the new ensemble. The procedure runs the recursive termination procedure for task Y. FIG. 4 shows Y has no predecessors, so the task's device termination procedure pointer is resolved and the device termination procedure is run with logical unit identifier Y thus breaking the connection Y.

The terminate-to-install-new-devices procedure determines which tasks in the current ensemble must be run so new devices can be brought into use. The procedure performs another set subtraction operation, Ensemble-2−CurrentEnsemble to find tasks in the new ensemble with no counterparts in the current ensemble. FIG. 7 shows these tasks in the right-most portion of the Venn diagram: Tasks ARM, Z and Q are for the new devices. The Ensemble-2 box 80 of FIG. 6 shows only tasks Z and Q have predecessors. Z requires the ARM power supply to be off before connection Z can turn off (forbidden state is 'not Z and ARM'), so the technique infers ARM must be off before Z can turn on. Since ARM has no counterpart in the current ensemble, its device ARM 76 is assumed to be off. Task Q also has ARM as a predecessor, and it is ignored for the same reason.

The ensemble optimization procedure completes by installing a pointer to the new ensemble, Ensemble-2, as the current ensemble pointer and returns to the RPM test module. FIG. 8 shows the system as the RPM test begins: SHUNT is still on and is connected via X to the motor. The RPM test procedure will set up connections Z and Q and turn on the ARM power supply to realize the desired configuration of FIG. 5.

FIG. 5 thus represents the configuration of the test system after the RPM test is completed. FIG. 9 shows the configuration 82 needed for a SHUNT voltage test. A different armature power supply bARM 84 and connection R are used as well as a voltage measurement device V 86 and connection U.

Figure 10:
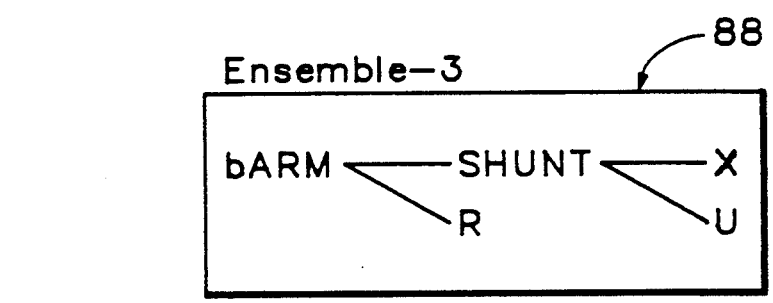
FIG. 10 is an ensemble associated with the configuration of FIG. 9.

FIG. 6 shows Ensemble-2, the current ensemble. FIG. 10, in a box 88 shows the ensemble, Ensemble-3, associated with a group of devices in FIG. 9.

Figure 11:
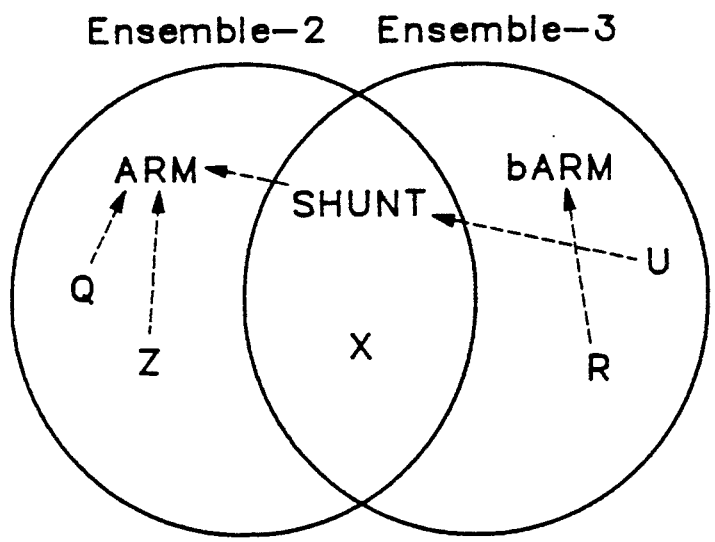
FIG. 11 is a Venn diagram illustrating the relationship between the devices included in ensembles 2 and 3.

Using the terminate-to-remove-old-devices procedure, it is determined that tasks Q, Z, and ARM must be turned off, as shown in the left-most area of the Venn diagram of FIG. 11. The recursive termination procedures run for Q finds predecessor ARM, as illustrated by the dashed lines in FIG. 11, and in the ensemble box of FIG. 6. Since task ARM has no predecessors, its associated instrument termination procedure is run and ARM's termination flag is set.

According to the terminate-to-remove-old-devices procedure, the recursive device termination procedure is run for task Z next. Another recursive attempt to terminate ARM is made. The ARM task is already flagged as off, so device Z is terminated. Finally, the terminate-to-remove-old-devices procedure is used to deal with the task ARM, which is already flagged as off. So the procedure control returns to the ensemble optimization procedure.

The right-most area of FIG. 17 shows three tasks considered using the terminate-to-install-new-devices procedure: bARM, U and R. FIG. 11 shows that only task U has a predecessor with a counterpart in the current ensemble. The recursive device termination procedure is run for the counterpart, SHUNT. SHUNT has ARM as a predecessor, so the recursive termination procedure is called recursively for ARM. Task ARM is already flagged as off, so the device termination procedure is run for SHUNT. This allows device U to safely setup. The bARM power supply must be off before connection to R can turn on. Since bARM has no counterpart in the current ensemble, its device bARM 84 is assumed to be off. The ensemble optimization procedure installs a pointer to the new ensemble, Ensemble-3, as the current ensemble pointer. The procedure returns to the voltage measurement test. After the voltage measurement test module is completed, the test program completes by running the current ensemble termination procedure to turn off in proper order the devices shown in FIG. 9 that are currently on. Executing this procedure causes the running of recursive termination procedures for termination tasks of the ensemble pointed to by the current ensemble pointer, as shown in Ensemble-3 box 88.

It will be seen that the present invention optimally reduces device cycling between test program modules according to the constraints represented in the ensemble data structure. It permits programmers to create, position and reuse test program modules devoted to different measurement tasks. The modules can be invoked in any order or reused in other test procedures without modification or lengthy program analysis.

This method can also provide an additional measure of system and operator safety. At any time during execution of the test program, the current ensemble termination procedure can be invoked to return the system to a safe state. For example, interrupts from an operator's STOP key or from a failing or overloaded device can be usefully handled by immediately turning off the current group of devices in the proper order.

Finally, the total execution time of the test program is reduced. Both the time spent communicating with the devices and the time spent waiting for them to settle is eliminated when nothing needs to be done with them.

Thus, while the invention has been described with reference to the foregoing preferred system, it will be understood that variations in the form and design of the preferred system and method may be made without varying from the spirit or scope of the invention as described in the claims.

I claim:

1. A method for selectively deactivating computer-controlled devices used to perform a sequence of operations, with each operation using an associated set of the devices, the method comprising:
   storing in a computer memory a list of the devices used for each operation;
   prior to performing a current operation, determining from the stored lists those devices that will not be used in the current operation; and
   generating commands for deactivating those devices that will not be used in the current operation.

2. A method according to claim 1 further comprising the step of storing in the computer memory, for each operation, data defining an order of deactivation of the devices in the operation; the step of generating including generating commands for deactivating the devices according to the defined order of deactivation.

3. A method according to claim 2 further comprising the steps of determining, using the reverse of the defined order of deactivation, those devices used in the current operation that must be deactivated before the devices to be used can be activated; and generating commands for deactivating those devices that must be deactivated before the devices to be used can be activated.

4. A method according to claim 1 further comprising the steps of storing in the computer memory, for each device, data defining other devices that must be deactivated prior to deactivating that device; and generating commands for deactivating, for each device to be deactivated, each of the other devices that must be deactivated prior to deactivating that device.

5. A method according to claim 1 further comprising the step of storing status data indicating, for each device, whether the device is currently activated or deactivated; the steps of generating commands for deactivating devices further comprising determining the status data associated with each device to be deactivated, and generating the commands for deactivating the device only if the status data indicates the device is currently activated.

6. A method according to claim 1 further comprising the step of storing, for each operation, data identifying the set of devices used in that operation and an indicator indicating which set of devices is currently activated.

7. A method according to claim 1 further comprising the step of storing data defining a deactivation procedure for deactivating each device.

8. A method according to claim 7 where the devices are categorized into a plurality of types, the step of storing data defining a deactivation procedure includes storing data defining a deactivation procedure for deactivating each type of device, and storing data identifying the type of each device; the step of generating commands comprising generating commands for each device to be deactivated according to the stored deactivation procedure associated with the device type.

9. A method according to claim 8 further comprising producing status data indicating whether each device is currently activated or deactivated.

10. A method of controlling the deactivating of computer-controlled test equipment during a plurality of tests, with each test using one of a plurality of sets of test devices, the method comprising the steps of:
    storing in the memory of a test-equipment-controlling computer system data defining the tests that are to be performed and the set of test devices required for each test, and data identifying the set of devices currently activated and the set of devices to be used for the next test;
    determining, for each next test, the devices in the currently activated set that will not be used in the next test; and
    generating commands for deactivating those devices that are in the currently activated set that will not be used in the next test.

11. A method according to claim 10 further comprising the step of storing in the computer memory, for each device, a device termination procedure for turning off the device, a device status indicator indicating whether the device is currently activated or deactivated, and a list of other devices that must be deactivated before this device can be deactivated; the step of generating commands including, for each device to be deactivated, generating commands for deactivating all devices in the list of other devices prior to generating commands for deactivating the device, generating commands for deactivating the device using the associated device termination procedure, and setting the associated status indicator to indicate the device is deactivated.

12. A system for selectively deactivating computer-controlled devices used to perform a sequence of operations with each operation using an associated set of the devices, the system comprising:
    user-operable input means for inputting instructions comprising a plurality of operation modules, each operation module defining an operation to be performed using the associated set of devices, and data defining a list of the devices used for each operation; and programmable computer means including memory means for storing computer program instructions and data, and processing means coupled to the input means and to the memory means for executing the stored program instructions, the processing means being responsive to the input data for, prior to performing a current operation, determining from the stored lists those devices that will not be used in the current operation; and generating commands for deactivating those devices that will not be used in the current operation.

13. A system according to claim 12 wherein the input means is operable for inputting in the computer memory, for each operation, data defining an order of deactivation of the devices in the operation; the processing means generating commands for deactivating the devices according to the defined order of deactivation.

14. A system according to claim 13 wherein the processing means further determines, using the reverse of the defined order of deactivation, those devices used in the current operation that must be deactivated before the devices to be used can be activated; and generates commands for deactivating those devices that must be deactivated before the devices to be used can be activated.

15. A system according to claim 12 wherein the input means is further operable for inputting in the computer memory, for each device, data defining other devices that must be deactivated prior to deactivating that device; and the processing means further generates commands for deactivating, for each device to be deactivated, each of the other devices that must be deactivated prior to deactivating that device.

16. A system according to claim 12 wherein the processing means further stores status data indicating, for each device, whether the device is currently activated or deactivated; determines the status data associated with each device to be deactivated, and generates the commands for deactivating the device only if the status data indicates the device is currently activated.

17. A system according to claim 12 wherein the input means is further operable for inputting, for each operation, data identifying the set of devices used in that operation, and the processing means stores an indicator indicating which set of devices is currently activated.

18. A system according to claim 12 wherein the input means is further operable for storing data defining a deactivation procedure for deactivating each device.

19. A system according to claim 18 wherein the input means is operable for inputting a device type for each device, and inputting data defining a deactivation procedure for deactivating each type of device; the processing means generating commands for each device to be deactivated according to the stored deactivation procedure associated with the device type.

20. A system according to claim 19 wherein the processing means further produces status data indicating whether each device is currently activated or deactivated.

21. A system for controlling the deactivating of computer-controlled test equipment during a plurality of tests, with each test using one of a plurality of sets of test devices, the system comprising:

user-operable input means for inputting instructions defining the tests that are to be performed and data defining the set of test devices required for each test; and programmable computer means including memory means for storing computer program instructions and data, and processing means coupled to the input means and to the memory means for executing the stored program instructions, the processing means being responsive to the input data for generating data identifying the set of devices currently activated and the set of devices to be used for the next test, determining, for each next test, the devices in the currently activated set that will not be used in the next test, and generating commands for deactivating those devices that are in the currently activated set that will not be used in the next test.

22. A system according to claim 21 wherein the input means is further operable for storing in the computer memory, for each device, a device termination procedure for deactivating the device, a device status indicator indicating whether the device is currently activated or deactivated, and a list of other devices that must be deactivated before this device can be deactivated; the processing means, for each device to be deactivated, generating commands for deactivating all devices in the list of other devices prior to generating commands for deactivating the device, generating commands for deactivating the device using the associated device termination procedure, and setting the associated status indicator to indicate the device is deactivated.

* * * * *